(12) United States Patent
Sicard et al.

(10) Patent No.: US 9,531,373 B2
(45) Date of Patent: Dec. 27, 2016

(54) GATE DRIVE CIRCUIT AND A METHOD FOR SETTING UP A GATE DRIVE CIRCUIT

(71) Applicants: Thierry Sicard, Auzeville Tolosane (FR); Philippe Perruchoud, Tournefeuille (FR)

(72) Inventors: Thierry Sicard, Auzeville Tolosane (FR); Philippe Perruchoud, Tournefeuille (FR)

(73) Assignee: NXP USA, Inc., Austin, TX (US)

( * ) Notice: Subject to any disclaimer, the term of this patent is extended or adjusted under 35 U.S.C. 154(b) by 0 days.

(21) Appl. No.: 14/899,506

(22) PCT Filed: Jul. 4, 2013

(86) PCT No.: PCT/IB2013/001766
§ 371 (c)(1),
(2) Date: Dec. 17, 2015

(87) PCT Pub. No.: WO2015/001373
PCT Pub. Date: Jan. 8, 2015

(65) Prior Publication Data
US 2016/0149569 A1 May 26, 2016

(51) Int. Cl.
*H03K 3/00* (2006.01)
*H03K 17/567* (2006.01)
(Continued)

(52) U.S. Cl.
CPC ............ *H03K 17/567* (2013.01); *H03K 17/06* (2013.01); *H02M 7/5387* (2013.01)

(58) Field of Classification Search
None
See application file for complete search history.

(56) References Cited

U.S. PATENT DOCUMENTS

| 5,455,758 A | 10/1995 | Pelly |
| 6,310,449 B1 | 10/2001 | Dorfer |

(Continued)

FOREIGN PATENT DOCUMENTS

JP H0698560 4/1994

OTHER PUBLICATIONS

International Search Report and Written Opinion correlating to PCT/IB2013/001766 issued on Mar. 14, 2014.

*Primary Examiner* — Lincoln Donovan
*Assistant Examiner* — Khareem E Almo
(74) *Attorney, Agent, or Firm* — Charlene R. Jacobsen

(57) ABSTRACT

A gate drive circuit includes a first switch and a first capacitor. A first terminal of the first capacitor is electrically coupled to the first switch. The first switch is electrically coupled between the first terminal and a voltage supply of the power transistor. A second terminal of the first capacitor is electrically coupled to the reference potential. The gate drive circuit further includes a first voltage limiter in parallel with the first capacitor. The first voltage limiter limits a voltage across the first capacitor to a first predetermined voltage. The gate drive circuit further includes a second capacitor, a pre-charging circuit arranged between the first terminal of the first capacitor and a first terminal of the second capacitor. The gate drive circuit further includes a third capacitor with a first terminal electrically coupled to a second terminal of the second capacitor and a second terminal electrically coupled to a gate terminal of the power transistor.

18 Claims, 7 Drawing Sheets

(51) Int. Cl.
  *H03K 17/06*  (2006.01)
  *H02M 7/5387*  (2007.01)

(56) References Cited

U.S. PATENT DOCUMENTS

| | | | |
|---|---|---|---|
| 7,109,780 B2 | 9/2006 | Miettinen | |
| 7,667,524 B2* | 2/2010 | Thierry | H03K 4/00 327/374 |
| 2009/0027096 A1* | 1/2009 | Mourrier | H03K 17/166 327/170 |
| 2010/0207450 A1 | 8/2010 | Ogawa et al. | |
| 2013/0200928 A1* | 8/2013 | Knoedgen | H03K 17/163 327/109 |
| 2015/0280705 A1* | 10/2015 | Sicard | H03K 17/0828 327/109 |
| 2015/0280706 A1* | 10/2015 | Sicard | H03K 17/0828 327/432 |
| 2015/0288356 A1* | 10/2015 | Sicard | H03K 17/567 327/382 |
| 2016/0149515 A1* | 5/2016 | Sicard | H03K 17/06 363/98 |
| 2016/0149569 A1* | 5/2016 | Sicard | H03K 17/06 327/109 |
| 2016/0211841 A1* | 7/2016 | Harrison | H02M 1/44 |

\* cited by examiner

GATE DRIVE CIRCUIT AND A METHOD FOR SETTING UP A GATE DRIVE CIRCUIT

FIELD OF THE INVENTION

This invention relates to a gate drive circuit used to drive a power transistor. The invention further relates to a power module that includes the gate drive circuit and the power transistor. The invention further relates to a method of setting up the gate drive circuit.

BACKGROUND OF THE INVENTION

Motor control may have a wide range of applications. The applications may include, among others, electrical motors for electric vehicles, hybrid cars but also electrical motors for residential washing machines, fans, hand-held power tools, industrial motor drives, etc.

Induction or asynchronous motors are typically used in the above mentioned applications. Induction or asynchronous motors are AC motors in which a current is induced by electromagnetic induction in a rotating winding by a magnetic field generated in a static winding. Induction or asynchronous motors do not require sliding electric contacts electrically connecting the rotating winding to the static winding, thereby simplifying construction and improving reliability of the induction or asynchronous motors.

Availability of affordable, reliable power transistors (e.g., power MOSFETs and IGBTs) and modules capable to drive such induction or asynchronous motors are an important design goal in the above mentioned applications.

In three phases induction or asynchronous motors, so-called half bridges or full bridge topologies are commonly used. In half-bridge or full bridge topologies six power transistors may be used, three power transistors for a top side of the bridge and three power transistors for the bottom side of the bridge. Each power transistor of the top or bottom side of the bridge is arranged with another power transistor of the bottom or top side of the bridge in an inverter pair topology. Each pair of power transistors is in this away arranged to be used for each phase of the induction or asynchronous motor.

Typically, a gate drive circuit controls a gate of the power transistor in a way that when one power transistor of the inverter pair is on the other power transistor of the inverter pair is off.

Each inverter pair is typically supplied by a high voltage supply which may be in the example of electric vehicles applications the high voltage supply generated by a battery pack (e.g. a Lithium Ion battery pack) used to drive the electric motor of the electric car. This high voltage supply may be in the range of 200 to 300 Volts. The gate drive circuit is typically powered by a lower supply voltage derived and isolated from the high supply voltage. For example, it is common to use transformers (e.g. DC-DC converters) to generate the lower supply voltage used to supply the gate drive circuit.

There are however a few problems associated with the use of transformers in the above mentioned applications. One problem is that transformers are big and expensive components that take up a significant amount of the module space in which the gate drive circuits and the power transistors are also implemented. Another problem associated with the use of transformers is that transformers have typically parasitic capacitors between a primary winding and a secondary winding. By way of an example if the primary winding is connected to the high voltage supply and the secondary winding is connected at the low voltage supplied circuits, a fast and large change of an high output voltage during commutation may inject parasitic currents to the secondary winding through the parasitic capacitors. This in turn may negatively affect the gate drive circuit and all other circuitry connected to the low voltage supply at the second winding.

SUMMARY OF THE INVENTION

The present invention provides a gate drive circuit used to drive a gate terminal of a power transistor, a power module and a method of setting-up the gate drive circuit.

Specific embodiments of the invention are set forth in the dependent claims.

These and other aspects of the invention will be apparent from and elucidated with reference to the embodiments described hereinafter.

BRIEF DESCRIPTION OF THE DRAWINGS

Further details, aspects and embodiments of the invention will be described, by way of example only, with reference to the drawings. Elements in the figures are illustrated for simplicity and clarity and have not necessarily been drawn to scale.

Elements in the figures are illustrated for simplicity and clarity and have not necessarily been drawn to scale. In the Figures, elements which correspond to elements already described may have the same reference numerals.

DETAILED DESCRIPTION OF THE PREFERRED EMBODIMENTS

Figure 1:
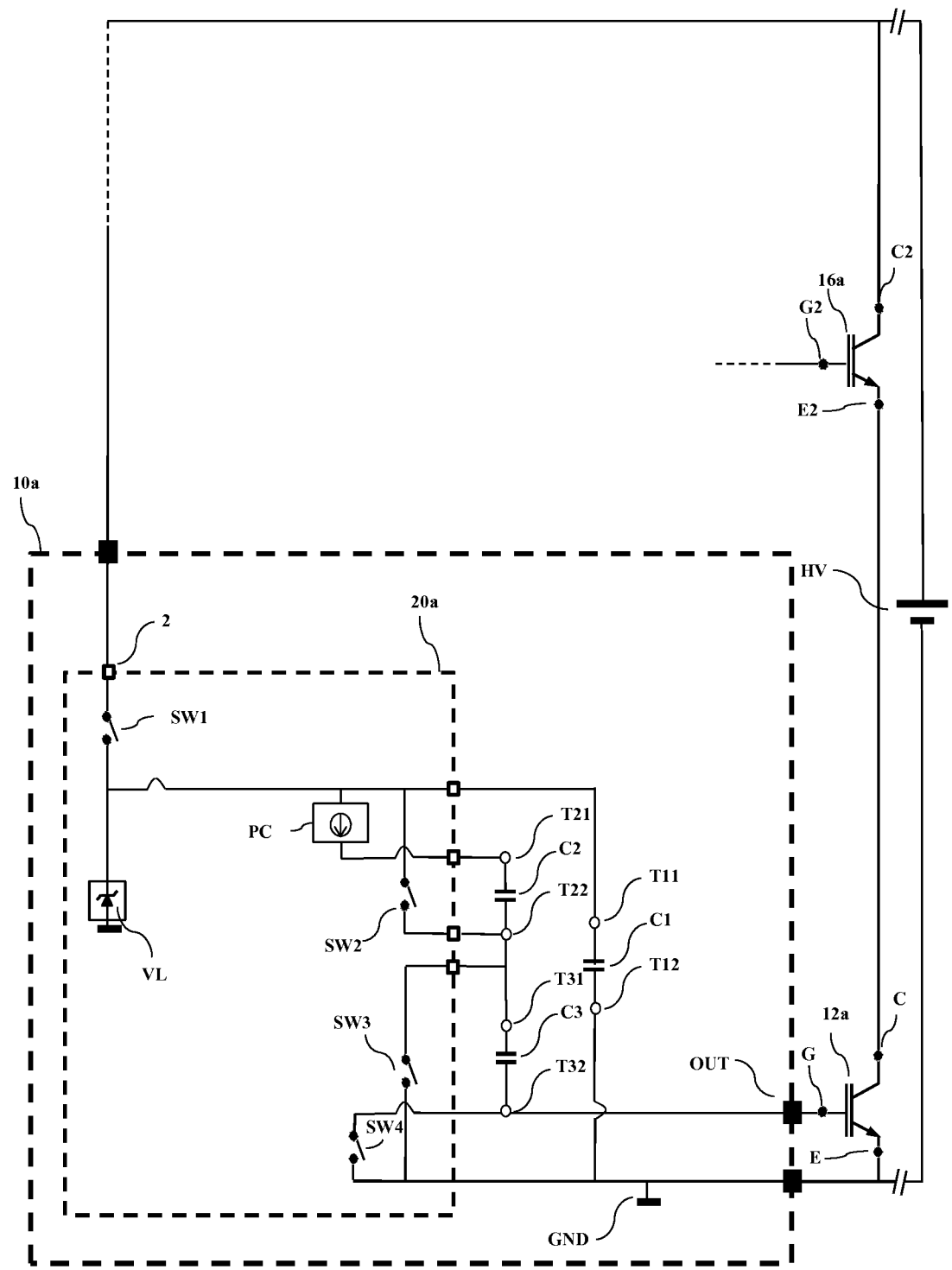
FIG. 1 schematically shows an example of an embodiment of a gate drive circuit.

FIG. 1 schematically shows an example of an embodiment of a gate drive circuit 10a. The gate drive circuit 10a is used to drive a gate terminal G of a power transistor 12a. The gate drive circuit 10a needs to be setup before the gate terminal G of the power transistor 12a may be driven. The setup of the gate drive circuit 10a is necessary to ensure a proper functioning of the gate drive circuit 10a during switching on and off the power transistor 12a (i.e. during operation of the power transistor 12a). The setup of the gate drive circuit 10a includes powering up the gate drive circuit 10a after that the gate drive circuit 10a is connected to a voltage supply. A proper setup of the gate drive circuit 10a also ensures that after an initial specific setup time, the gate drive circuit 10a may drive the power transistor 12a with a faster switching speed compared to a situation in which the gate drive circuit 12a may not be initially setup.

The power transistor 12a of FIG. 1 is an isolated gate bipolar transistor (i.e. IGBT) with a gate terminal G, an emitter terminal E and a collector terminal C. Alternatively, the power transistor 12a may be a FET transistor and in particular an N-channel FET transistor in which case the emitter terminal E is a source terminal and the collector terminal C is a drain terminal. As shown in FIG. 1 the power transistor 12a at a low side may be connected to a further power transistor 16a at a high side in a power inverter topology. The further power transistor 16a may also be an IGBT or an N-channel FET transistor of the same type of the power transistor 12a. The gate terminal G of the power transistor 12a at the low side is electrically coupled to an output OUT of the gate drive circuit 10a. The emitter terminal E of the power transistor 12a at the low side is electrically coupled to a reference potential GND, the collector terminal C of the power transistor 12a is electrically coupled to an emitter terminal E2 of the further power transistor 16a at the high side. A voltage supply HV powers the power inverter topology, thereby powering the low side power transistor 12a and the high side power transistor 16a. The voltage supply HV may be electrically coupled to a collector of the high side power transistor 16a. The voltage supply HV may be a high voltage supply derived for example from a battery. In electric vehicles batteries, the high voltage supply may be in the order of 300 V at a full charge. When the battery of the electric vehicles is discharged the high voltage supply may drop to 200 V.

The gate drive circuit of FIG. 1 includes a first switch SW1 and a first capacitor C1. The first switch SW1 is arranged between a first terminal T11 of the first capacitor C1 and the voltage supply HV of the low side power transistor 12a and the high side power transistor 16a. A second terminal of the first capacitor C1 is electrically coupled to the reference potential GND. The gate drive circuit of FIG. 1 further includes a first voltage limiter VL in parallel with the first capacitor C1. The first voltage limiter VL is limiting the voltage across the first capacitor C1 between the first terminal T11 and the second terminal T12 to a first predetermined voltage. The first voltage limiter VL may be a zener diode or a series of zener diodes with a cathode of the zener diode or a cathode of a zener diode of the series of zener diodes electrically coupled to the first terminal T11 of the first capacitor C1, and with an anode of the zener diode or an anode of a zener diode of the series of zener diodes electrically coupled to the reference ground GND. The zener diode or a zener diode of the series of zener diodes may be chosen to clamp a voltage across each zener diode to for example 10 V. The first voltage limiter VL may be made with three zener diodes in series. Each zener diode may clamp the voltage to 10V in a way that the voltage across the capacitor C1 may be clamped to the first predetermined voltage of 30 V. The gate drive circuit of FIG. 1 further includes a pre-charging circuit PC, a second capacitor C2, a third capacitor C3, a second switch SW2, a third switch SW3 and a fourth switch SW4. The pre-charging circuit PC is arranged between a first terminal T12 of the first capacitor C1 and a first terminal T21 of the second capacitor C2. The third capacitor C3 has a first terminal T31 electrically coupled to a second terminal T22 of the second capacitor C2, and a second terminal T32 electrically coupled to the gate terminal G of the low side power transistor 12a. The second switch SW2 is arranged between the first terminal T11 of the first capacitor C1 and the second terminal T22 of the second capacitor C2. The third switch SW3 is arranged between the first terminal T31 of the third capacitor C3 and the reference potential GND. The fourth switch SW4 is arranged between the second terminal T32 of the third capacitor C3 and the reference potential GND. The gate drive circuit 10a so far described is configured, during setting up and after applying the voltage supply HV, to charge the first capacitor C1 and to pre-charge the second and third capacitors C2 and C3. The first capacitor C1 is charged to a first predetermined voltage defined by the parallel first voltage limiter VL. The second and third capacitors C2, C3 are pre-charged to a second and to a third predetermined voltages which may be defined by similar voltage limiters used to limit the voltage across the first capacitor C1. For example the second capacitor C2 may be connected in parallel to a second voltage limiter and the third capacitor C3 may be connected in parallel to a third voltage limiter. The second and third predetermined voltages may be for example both 10 V. A 10V zener diode may be placed in parallel to the second capacitor C2 and to the third capacitor C3. The gate drive circuit 10a is powered by the voltage across the first capacitor C1 which is derived by electrically coupling the first switch SW1 between the first terminal T11 of the first capacitor C1 and the voltage supply HV. The first capacitor C1 may be a large capacitor capable to store large amount of charges. The first capacitor C1 may be for example 100 uF. Thus the voltage across the first capacitor C1 represents a power supply voltage of the gate drive circuit 10a. During a start-up of the gate drive circuit 10a shortly after that the voltage supply HV is applied, the first capacitor C1 starts charging. A charge built on the first capacitor C1 provides a voltage and a current that pre-charge the second capacitor C2 to the second predetermined voltage by means of the pre-charging circuit PC. The charge built on the first capacitor C1 provides also a voltage and a current that pre-charge the third capacitor C3 to the second predetermined voltage by means of the second switch SW2 that electrically couples the first terminal T11 of the first capacitor C1 to the first terminal T31 of the third capacitor C3. The third switch SW3 provides, when on, a path to the reference potential GND for the second terminal T22 of the second capacitor C2, thereby allowing a pre-charging of the second capacitor C2 to a second predetermined voltage with respect to the reference potential GND during the set-up of the gate drive circuit 10a. The fourth switch SW4 provides during powering up the voltage supply HV that no charges built across the third capacitor C3 may leak to the gate terminal G of the power transistor 12a, thereby ensuring a pre-charging of the third capacitor C3 to the third predetermined voltage without charge leakages. The third predetermined voltage generated during the setup of the gate drive circuit 10a is stored across the third capacitor C3 and may be used after the setup of the gate drive circuit 10a to drive the gate terminal G of the power transistor 12a. The second predetermined voltage added to the third predetermined voltage with respect to the reference potential GND is used during the setup and after setup of the gate drive circuit 10a to drive the second switch SW2. The second switch SW2 may be a NMOS transistor that in combination with the third switch SW3 may be used to drive the gate terminal G of the power transistor 12a. NMOS transistors are typically preferred to PMOS transistors in gate drive circuits because may be smaller for the same current capabilities. However, using NMOS transistors in place of PMOS transistors means that a voltage higher than the power supply voltage of the gate drive circuit 10a (i.e. the voltage across the first capacitor C1) may be needed to fully turn on the NMOS transistor, thereby minimizing an on resistance of the NMOS transistor in its main conductive path and thus consequently minimizing significant heat losses. The second capacitor C2 is therefore used during the setup of the gate drive circuit to drive the second switch SW2 (e.g. a gate of an NMOS transistor) as a current source to pre-charge the third capacitor C3. The second capacitor C2 may be also used after the setup of the gate drive circuit 10a to lift the voltage at the first terminal T21 of the second capacitor C2 with respect to the reference potential GND above the power supply voltage of the gate drive circuit 10a to fully turn-on the second switch SW2. The second capacitor C2 may thus function after the setup of the gate drive circuit 10a as a so called Bootstrap capacitor. The pre-charging circuit PC may be for example a current source configured to the pre-charge the second capacitor C2 to the second predetermined voltage in series with a diode to avoid that the second capacitor C2 discharges when the voltage at the first terminal T21 is above the power supply of the gate drive circuit 10a, i.e. during a "Bootstrap" operation. By charging the capacitor C1 to the first predetermined voltage, by pre-charging the second and third capacitors C2 and C3 to a second and third predetermined voltages, the gate drive circuit 10a is setup and ready to be used to drive the gate terminal G of the power transistor 12a.

Figure 2:
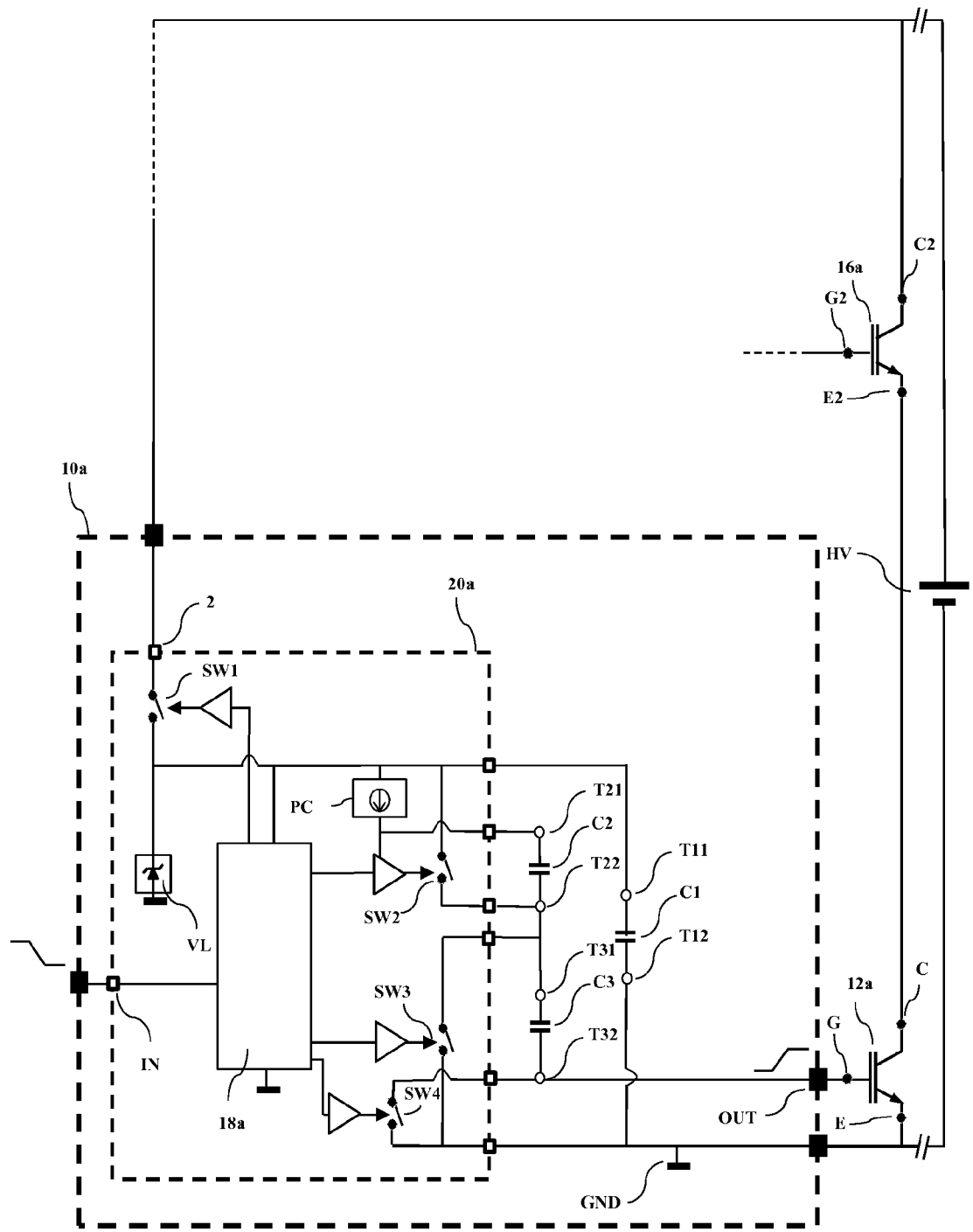
FIG. 2 schematically shows another example of an embodiment of a gate drive circuit.

FIG. 2 shows a further practical example according to the invention. In FIG. 2 the gate drive circuit 10a includes a controller 18a to control the first, the second, the third, the fourth switches SW1, SW2, SW3, SW4 and the pre-charging circuit PC during the set-up of the gate drive circuit 10a. In the example shown in FIG. 2 the controller 18a controls the four switches SW1, SW2, SW3, SW4 by means of buffers. The buffers shown in FIG. 2 are drawn with a triangular shape. Alternatively the buffers may be integrated in the controller 18a or the controller 18a may control the four switches SW1, SW2, SW3, SW4 without buffers. During the setup of the gate drive circuit 10a, the controller 18a arranges the fourth switch SW4 to an on state so that the gate terminal G of the power transistor 12a is electrically coupled to the reference potential GND. At this moment charging of the first, the second and third capacitors C1, C2 and C3 may start. During setting up the gate drive circuit 10a, the controller 18a controls the first switch SW1 in an on state so that charging of the first capacitor C1 may start. During or after charging the first capacitor C1 to the first predetermined voltage, the controller 18a configures the pre-charging circuit PC to pre-charge the second capacitor C2 to a second predetermined voltage. While or after pre-charging the second capacitor C2 to a second predetermined voltage value, the controller 10a arranges the third switch SW3 in an on state to electrically couple the second terminal T22 of the second capacitor C2 to the reference potential GND. In this way a voltage across the capacitor C2 may be built with reference to the reference potential GND. Once the voltage across the second capacitor C2 has reached the second predetermined voltage, the controller 18a arranges the third switch SW3 in an off state to electrically decouple the first terminal T31 of the third capacitor C3 from the reference potential GND. During a time in which the third switch SW3 is in off state, the controller 18a configures the second switch SW2 as a current source to pre-charge the capacitor C3 to a third predetermined voltage. The voltage built across the first capacitor C1 is the power supply of the gate drive circuit 10a and of the controller 18a. By having a charging/pre-charging sequence controlled by the controller 18a the charging/pre-charging sequence may be controlled over time and the charging/pre-charging across each of the first, the second and the third capacitors C1, C2 and C3 may be performed more accurately. If, for example, the power transistor 12a is an IGBT, the gate terminal G of the power transistor 12a may need to be typically driven with an internal gate voltage of 15V in order to fully turn-on the IGBT in a conductive state. Lower or higher internal gate voltages may respectively lead to a less optimized conductive state or to a breakdown of the IGBT. Said in other words, the gate drive circuit 10a may be powered on before that the gate drive circuit 10a may be able to drive the gate terminal G of the low side power transistor 12a. Powering on the gate drive circuit 10a may imply to apply the supply voltage HV to the power transistor 12a. The supply voltage HV may be applied to the collector of the high side power transistor 16a arranged in an inverter topology with the low side power transistor 12a. At the moment that the supply voltage HV is applied, it ramps-up from 0 Volts to its nominal value (e.g. 300 V for batteries used in electric cars). At time 0 before applying the supply voltage HV, the first, the second and the third capacitors C1, C2 and C3 are all discharged. At time 0 and during ramping of the supply voltage HV the first switch SW1 is closed so that the first capacitor C1 is electrically coupled to the supply voltage HV through the first switch SW1. A current generated from the supply voltage HV charges the first capacitor C1 to the first predetermined voltage determined by the first voltage limiter VL in parallel with the first capacitor C1. During or after charging the first capacitor C1, the second and third capacitors C2, C3 are also pre-charged. The pre-charging circuit PC charges the second capacitor C2 at a second predetermined voltage while the second switch SW2 remains in an off state and the third switch SW3 remains in an on state to pull the second terminal T22 of the second capacitor C2 to the reference potential GND. Once the second capacitor C2 has been charged to the second predetermined voltage, the second switch SW2 may be driven as a current source that may be used to pre-charge the third capacitor C3 while the third switch SW3 remains in an off state. During the set-up of the gate drive circuit 10a the fourth switch SW4 remains in an on state to electrically couple the second terminal T32 of the third capacitor C3 to the gate terminal G of the power transistor 12a and to reference potential GND. Once the set-up of the gate drive circuit 10a has been completed, i.e. whenever a voltage across the first capacitor C1 has reached the first predetermined voltage, a voltage across the second capacitor C2 has reached the second predetermined value and a voltage across the third capacitor C3 has reached the third predetermined value, the controller 18a may arrange the first switch SW1 to an off state to electrically disconnect the voltage supply HV from the first capacitor C1. In this manner there may be no more current consumption in a path electrically coupling the first capacitor C1 to the voltage supply HV.

In another example according to the invention, the controller 18a of the gate drive circuit 10a includes an input IN to control a state of the gate terminal G of the power transistor 12a after that the gate drive circuit 10a has been setup, i.e. after that a voltage across the first capacitor C1 has reached the first predetermined voltage, a voltage across the second capacitor C2 has reached the second predetermined value and a voltage across the third capacitor C3 has reached the third predetermined value. Depending on a status of the input IN of the controller 18a, the gate terminal G of the power transistor 12a may be maintained to be electrically coupled to the reference potential GND with the fourth switch SW4 in an on state or alternatively may be pulled up (e.g. to 15 V in case of an IGBT power transistor) to bring the power transistor 12a to a conductive mode. In a further example according to the invention the input IN of the controller 18a may be electrically coupled to the reference ground GND in which case the gate terminal G of the power transistor 12a may be pulled up to bring the power transistor 12a in a conductive state. Alternatively the input IN of the controller 18a may be left open, i.e. not electrically connected at one side, in which case the gate terminal G of the power transistor 12a may remain electrically coupled to the reference potential GND after that the gate drive circuit 10a has been setup. By having a control input IN that controls the status of the gate terminal G after that the gate drive circuit 10a has been setup, the same gate drive circuit 10a may be used to drive the low side power transistor 12a and/or the high power transistor 16a. The control input IN may be used to distinguish between the gate drive circuit 10a used for the low side power transistor 10a and a gate drive circuit used to drive the high side power transistor 16a. In the above example when the input IN is electrically coupled to the reference ground GND a charge transfer from the third capacitor C3 to a gate-emitter capacitance of the power transistor 12a may occur in which case the gate-emitter capacitance of the power transistor 12a may be charged and the power transistor 12a may be brought to the conductive state.

Figure 3:
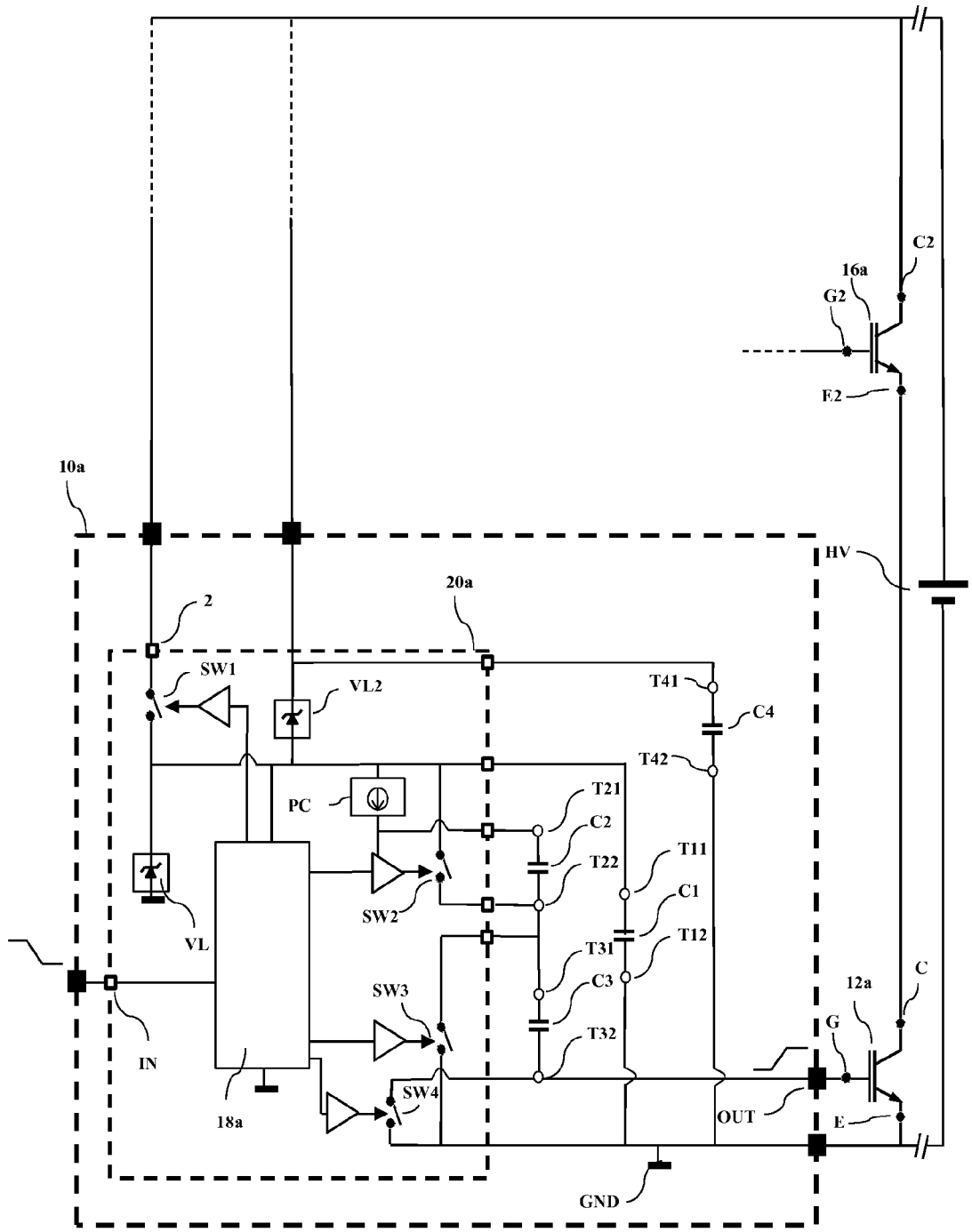
FIG. 3 schematically shows a further example of an embodiment of a gate drive circuit.

In another example according to the invention, shown in FIG. 3, the gate drive circuit 10a may include an additional fourth capacitor C4 with a first terminal T41 electrically coupled to the voltage supply HV and a second terminal electrically coupled to the reference ground GND. The gate drive circuit 10a shown in FIG. 3 further includes a second voltage limiter VL2 arranged between the first terminal T41 of the fourth capacitor C4 and the first terminal T11 of the first capacitor C1. The second voltage limiter VL2 may be a 10 V zener diode with a cathode electrically coupled to the first terminal T41 of the fourth capacitor C4 and with an anode electrically coupled to the first terminal T11 of the first capacitor C1. The second voltage limiter VL2 may be used to clamp a voltage across the fourth capacitor C4 to a further predetermined voltage determined by the sum of the first predetermined voltage with a voltage across the second voltage limiter VL2. In such a way a reference voltage across the fourth capacitor C4 higher than the first predetermined voltage may be generated and used to drive or supply part of the gate drive circuit 10a that may work at higher voltage. The fourth capacitor C4 may also be used as a decoupling capacitor, thereby providing some current to that part of the gate drive circuit 10a connected to the first terminal T41 of the fourth capacitor C4. The fourth capacitor C4 may be much smaller than the first capacitor C1, e.g. the fourth capacitor C4 may be 1000 times smaller than the first capacitor C1: the first capacitor C1 may be for example 100 uF and the fifth capacitor may be for example 100 nF. In this example during set-up of the gate drive circuit 10a the fourth capacitor C4 may be rapidly charged, e.g. in about 6 ms. The voltage across the fourth capacitor C4 may rapidly reach a level initially determined only by the second voltage limiter VL2 (e.g. 10V in the case that the second voltage limiter VL2 is a 10V zener diode) and later reach a level determined by both the first voltage limiter VL and by the second voltage limiter VL2 (e.g. 40 V in the case that the first voltage limiter VL is a series of three 10 V zener diodes). Therefore the fourth capacitor C4 may provide some current to that part of the gate drive circuit 10a connected to the first terminal T41 of the fourth capacitor C4 before the first capacitor C1 starts charging.

Figure 4:
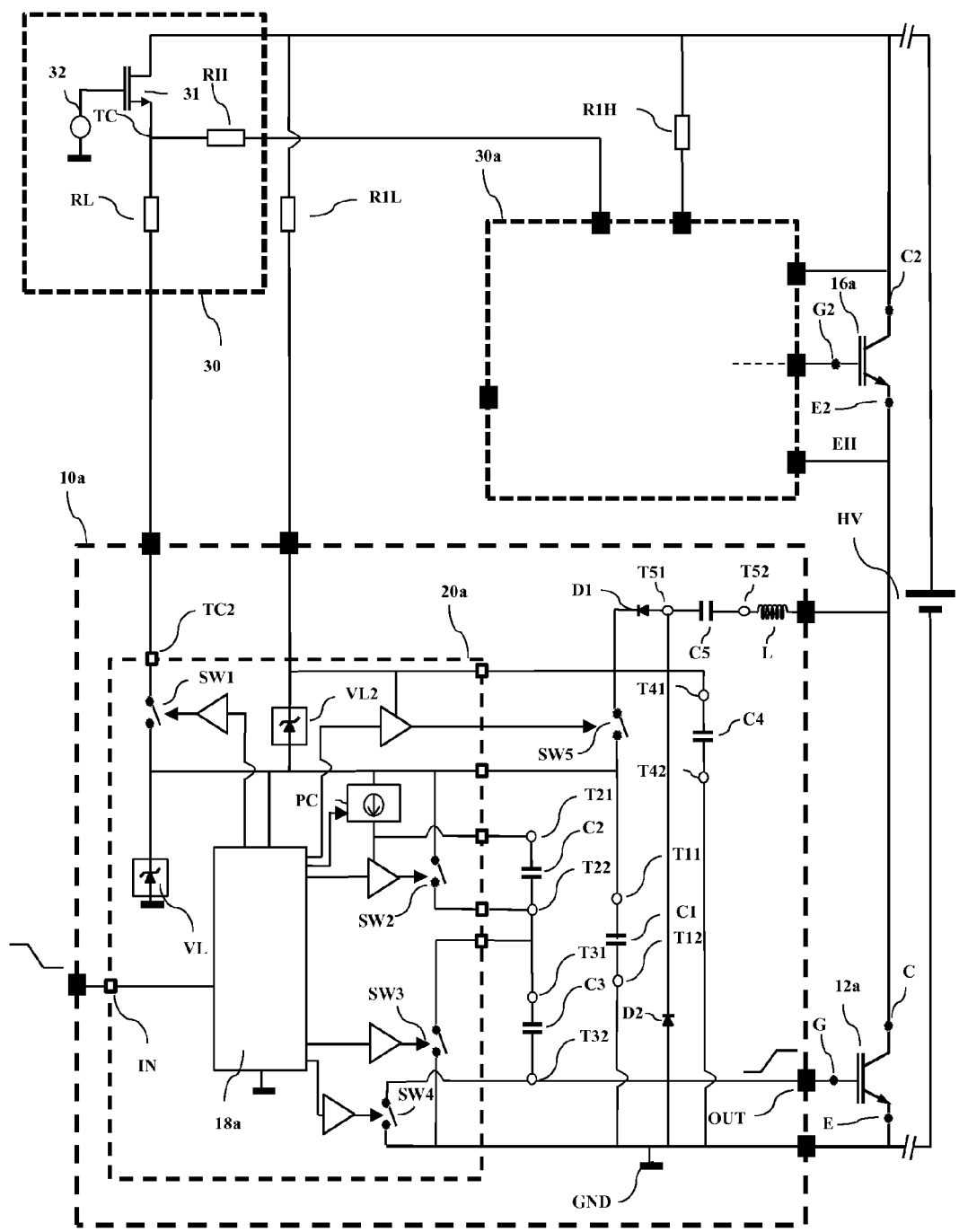
FIG. 4 schematically shows another example of an embodiment of a gate drive circuit and an example of a power module that includes the gate drive circuit.

In a further example according to the invention shown in FIG. 4 the gate drive circuit 10a further includes a fifth switch SW5, a fifth capacitor C5, an inductor L, a first and a second diodes D1, D2. The fifth switch SW5 is electrically coupled between the first terminal T11 of the first capacitor C1 and a cathode of the first diode D1. A first terminal T51 of the fifth capacitor C5 is electrically coupled to an anode of the first diode D1 and to a cathode of the second diode D2. A second terminal T52 of the fifth capacitor C5 is electrically coupled to a terminal of the inductor L. Another terminal of the inductor L is electrically coupled to the collector terminal C of the power transistor 12a. An anode of the second diode D2 is electrically coupled to the reference potential GND. In this further example the voltage across the fourth capacitor C4, i.e. the further pre-determined voltage, may provide a supply for a driver (e.g. a buffer as shown in FIG. 4) of the fifth switch SW5. As explained earlier, after the setup of the gate drive circuit 10a, all capacitors C1, C2, C3 and C4 may be charged or pre-charged to the corresponding predetermined voltages. A state of the input IN of the controller 18a may decide whether or not the gate terminal G of the power transistor 12a may be pulled up so that a setup of a further gate drive circuit 30a at a high side may start. If the gate drive circuit 10a is a gate drive circuit of the low side power transistor 12a, as shown in FIGS. 1 to 4, then the input IN may be electrically coupled to the reference potential GND. In this case, after setup, the gate drive circuit 10a pulls up the gate terminal G of the power transistor 12a to bring the power transistor 12a in a conductive state. At this moment a further power transistor 16a connected at a high side in an inverter topology with the power transistor 12a, may have an emitter terminal E2 coupled to reference potential GND. As a consequence the setup of the further gate drive circuit 30a at the high side may start with the same sequence so far described for the low side gate drive circuit 12a. It should be noted that the further gate drive circuit 30a as shown in FIG. 4 is an empty box because there are no differences between the gate drive circuit 10a at the low side and the further gate drive circuit 30a at the high side. Only the input IN of the controller 10a may be used to distinguish between the two gate drive circuits 10a, 30a during operation. During switching of the low side power transistor 12a or during normal operation of the inverter topology, i.e. during alternative on and off switching of the low side and high side power transistor 12a, 16a and after setting up the low side and high side gate drive circuits 10a and 30a, the gate drive circuit 10a (or the further gate drive circuit 30a) may operate as a self-supplied gate drive circuit by drawing power from the power transistor 30a (or the further gate drive circuit 16a) in a way hereafter described. During switching of the low side power transistor 12a, the first capacitor C1 drives a current that is used by the second and third capacitors C2 and C3 to generate a charge on the gate terminal G to turn the power transistor 12a on or in a conducting state. Thus, the first capacitor C1 discharges during switching and a high voltage and a high current (i.e. high power) output signal is emitted from the collector terminal C of the power transistor 12a. The inductor L, the fifth capacitor C5, the first and the second diodes D1, D2 may form a resonant circuit driven by an AC source voltage. The AC source voltage may be a collector-emitter voltage (i.e., the voltage at the collector terminal C with reference to the reference potential GND) of the power transistor 12a during operation of the inverter topology formed by the low side and high side power transistors 12a, 16a. In the applications for electric vehicles this voltage may swing between 0 to 200-300 V. During operation a duty cycle of 1 to 99% may be possible. When the fifth switch SW5 is in an off state, the fifth switch SW5 blocks a current generated in the resonant circuit, when the fifth switch is in on state a current is supplied to the first capacitor C1 to recharge the first capacitor C1. At each collector-emitter voltage state change of the power transistor 12a (e.g., at each on and off state of the power transistor 12a) a resonant serial RLC circuit (e.g., inductor L, the fifth capacitor C5 and an internal resistance of the gate drive circuit 10a not shown in FIG. 4) injects oscillating current in D1 and D2 through the fifth switch SW5 when the fifth switch SW5 is on. The oscillating current is rectified by the first diode D1 in a positive cycle of the oscillating current and by the second diode D2 in a negative cycle of the oscillating current. Thus, an equivalent DC current is generated from an oscillating current that is generated in the resonant serial RLC circuit and rectified by the first and second diodes D1, D2. This equivalent DC current may be used to recharge the first capacitor C1 when needed. By adjusting an oscillation frequency of the resonant serial RLC circuit with respect to the duty cycle of operation of the inverter topology, it may be possible to optimize the equivalent DC current which may be used to recharge the first capacitor C1 for minimal heat dissipation.

FIG. 4 also shows how the first switch SW1 of the gate drive circuit 10a and an equivalent switch (not shown in FIG. 4) of the high side gate drive circuit 30a may be electrically coupled to the supply voltage HV and how the first terminal T41 of the fourth capacitor C4 and an equivalent first terminal of a first capacitor (not shown in FIG. 4) of the high side gate drive circuit 30a may be electrically coupled to the supply voltage HV. FIG. 4 shows a voltage clamp 30 that includes an N-channel FET transistor 31. A gate terminal of the N-channel FET transistor 31 is electrically coupled to a voltage source 32. The voltage source may be directly derived from the supply voltage HV (e.g. with a resistor and a reversed biased diode connected between the supply voltage the reference potential GND). A drain of the N-channel FET transistor 31 may be electrically coupled to the supply voltage HV. A source of the N-channel FET transistor 31 may be electrically coupled to a first and a second resistors RL, RH. The first and the second resistors RL,RH may be in series with the first switch SW1 of the low side gate drive circuit 10a and with the first switch (not shown in FIG. 4) of the high side gate drive circuit 30a. The N-channel FET transistor 31 functions as a cascode and limits a voltage at the source of N-channel FET transistor 31. In this way the voltage at the source of N-channel FET transistor 31 may be limited when, for example, the first switch SW1 of the low side gate drive circuit 10a and the first switch of the high side gate drive circuit 30a are in an off state. Accordingly lower voltages and thus smaller and cheaper switches (or other connected components) may be connected to the source terminal of the N-channel FET transistor 31. The first terminal T41 of the fourth capacitor C4 may be electrically coupled to the supply voltage HV with a series resistor R1L. An equivalent first terminal of a fourth capacitor (not shown in FIG. 4) of the high side gate drive circuit 30a may be electrically coupled to the supply voltage HV with a series resistor R1H. The series resistors R1I, R1H may be high voltage resistors with an high resistance value to provide a quiescent current for the circuits connected to the first terminal T41 of the fourth capacitor C4 and to the equivalent terminal of the high side gate drive circuit 30a.

Figure 5A:
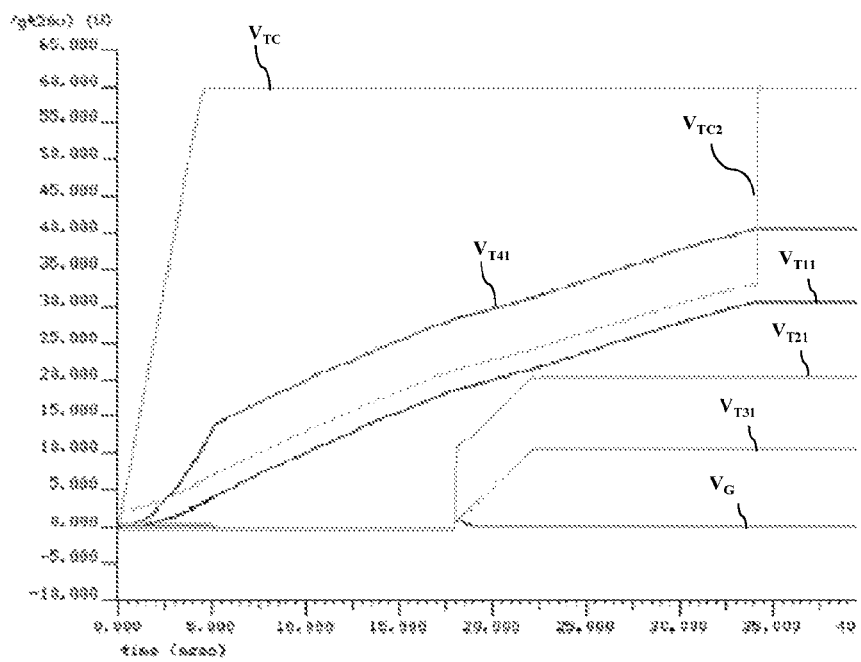
FIG. 5a graphically shows a set-up sequence for the gate drive circuit shown in Figure shown in FIG. 4.

FIG. 5a graphically shows the setup of the gate drive circuit 10a for the IGBT power transistor 12a after applying the supply voltage HV. The graph of FIG. 5a shows the node voltages corresponding to the terminal convention used for the schematic of FIG. 4. All node voltages are referred to the reference potential GND (e.g. typically a ground reference potential). In this example the voltage source 32 may generate 62 V so that the clamp voltage at terminal TC may be approximately 60 V (i.e. $V_{TC}$ in the graph). Node voltage $V_{TC2}$ is the node voltage at terminal TC2. When the first switch SW1 is in an on state the node voltage $V_{TC2}$ rises also to approximately 60 V because no more current may circulate across the first resistor RL. After applying the supply voltage HV, node voltage $V_{T41}$ starts rising charging the fourth capacitor C4. An intermediate node voltage of approximately 10 to 15 V is rapidly reached across the fourth capacitor in approximately 6 ms. This is visible by the knee shape of the node voltage $V_{T41}$. At the same time the first capacitor starts charging and a node voltage $V_{T11}$ is built across the first capacitor C1. During charging the first capacitor C1, the second capacitor C2 starts to be charged at a second predetermined voltage of approximately 10 V. This is visible from the node voltage $V_{T21}$. Once the node voltage $V_{T21}$ has reached the second predetermined voltage (i.e. 10 V in this example), the capacitor C3 starts to be charged to a second predetermined voltage of approximately 10 V. Finally the node voltage $V_{T11}$ reaches the first predetermined voltage of approximately 30V. The node voltage $V_{T11}$ is the main supply voltage of the gate drive circuit 10a and of the controller 18a of the gate drive circuit 10a. In this example the input IN of the controller 18a of the gate drive circuit 10a is left open (i.e. not connected at one side), thereby node voltage $V_G$ remains low and the power transistor 12a remains in an off state (i.e. in a not conductive state).

Figure 5B:
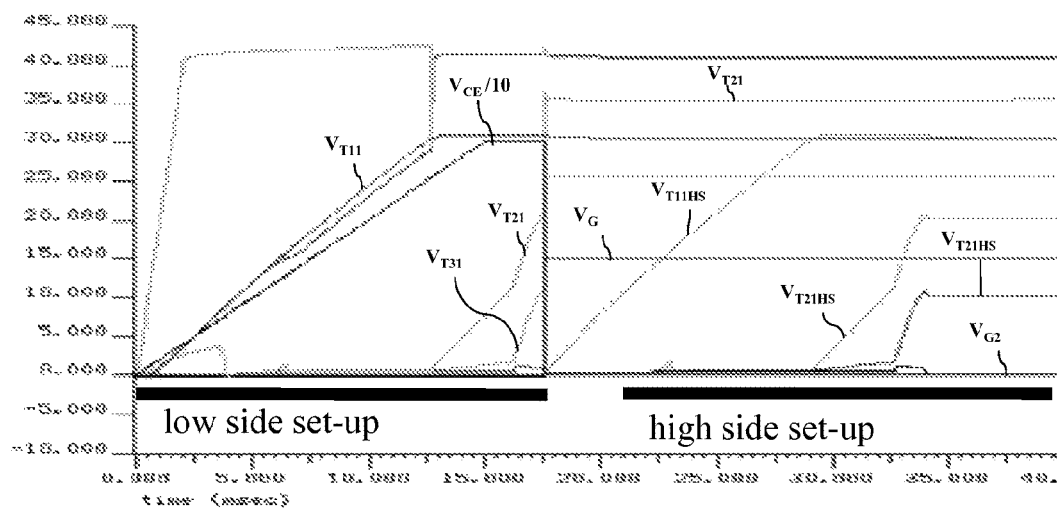
FIG. 5b graphically shows a set-up sequence for the low and high side gate drive circuits shown in FIG. 4.

FIG. 5b graphically shows the setup of the low side gate drive circuit 10a that drives the low side IGBT power transistor 12a and of the high side gate drive circuit 30a that drives the high side IGBT power transistor 16a after applying the supply voltage HV. The first half of FIG. 5b is similar to the FIG. 5a with the difference the pre-charging of the second and third capacitors C2, C3 starts at different timing than FIG. 5a. In the example of FIG. 5b the input IN of the controller 18a is connected to the reference potential GND, thereby the node voltage $V_G$ at the gate terminal G of the low side power transistor 12a is pulled up to approximately 15 V. At the switching point, the second switch SW2 is fully turned-on with the bootstrap capacitor C2 to minimize heat losses in the second switch SW2. A circuit, not shown here, forces the node voltage $V_G$ at the gate terminal G of the power transistor 12a to approximately 15 V. Once the low side IGBT power transistor 12a is turned on, the collector-emitter voltage $V_{CE}$ of the IGBT power transistor 12a goes from approximately the supply voltage HV (i.e. about 300 V) to the reference potential GND (i.e. about 0V). In the graph of FIG. 5b the shown collector-emitter voltage is the collector-emitter voltage $V_{CE}$ of the IGBT power transistor 12a divided by 10. In this way all voltage may visible on the same scale. It should be noted that all capacitors of the high side gate drive 30a are discharged at time 0. As a consequence a capacitive coupling electrically couples the supply voltage HV to an emitter terminal E2 of the high side IGBT power transistor 16a via all discharged capacitors of the high side gate drive circuit 30a. Thus when the supply voltage HV is applied, a transient voltage equivalent to the supply voltage HV may appear to the emitter terminal E2 of the high side power transistor 16a (i.e. an output of the power inverter). This effect is visible in the $V_{CE}/10$ curve. Once the collector-emitter voltage $V_{CE}$ of the IGBT power transistor 12a goes to the reference potential GND (i.e. 0 v), the emitter terminal E2 of the IGBT power transistor 16a goes also to the reference potential GND. At this moment the high side gate drive circuit 30a may have the low side reference potential GND as a reference potential. After that the setup of the high side gate drive circuit 30a may start with the same setup sequence as shown for the low side gate drive circuit 10a. Node voltages of the high side gate drive circuit 30a are indicated with the extension HS. In the example of FIG. 5b a controller input of the high gate drive circuit 30a is left open, so that the node voltage $V_{G2}$ at the gate terminal G2 of the high side IGBT power transistor 16a remains low.

Figure 6:
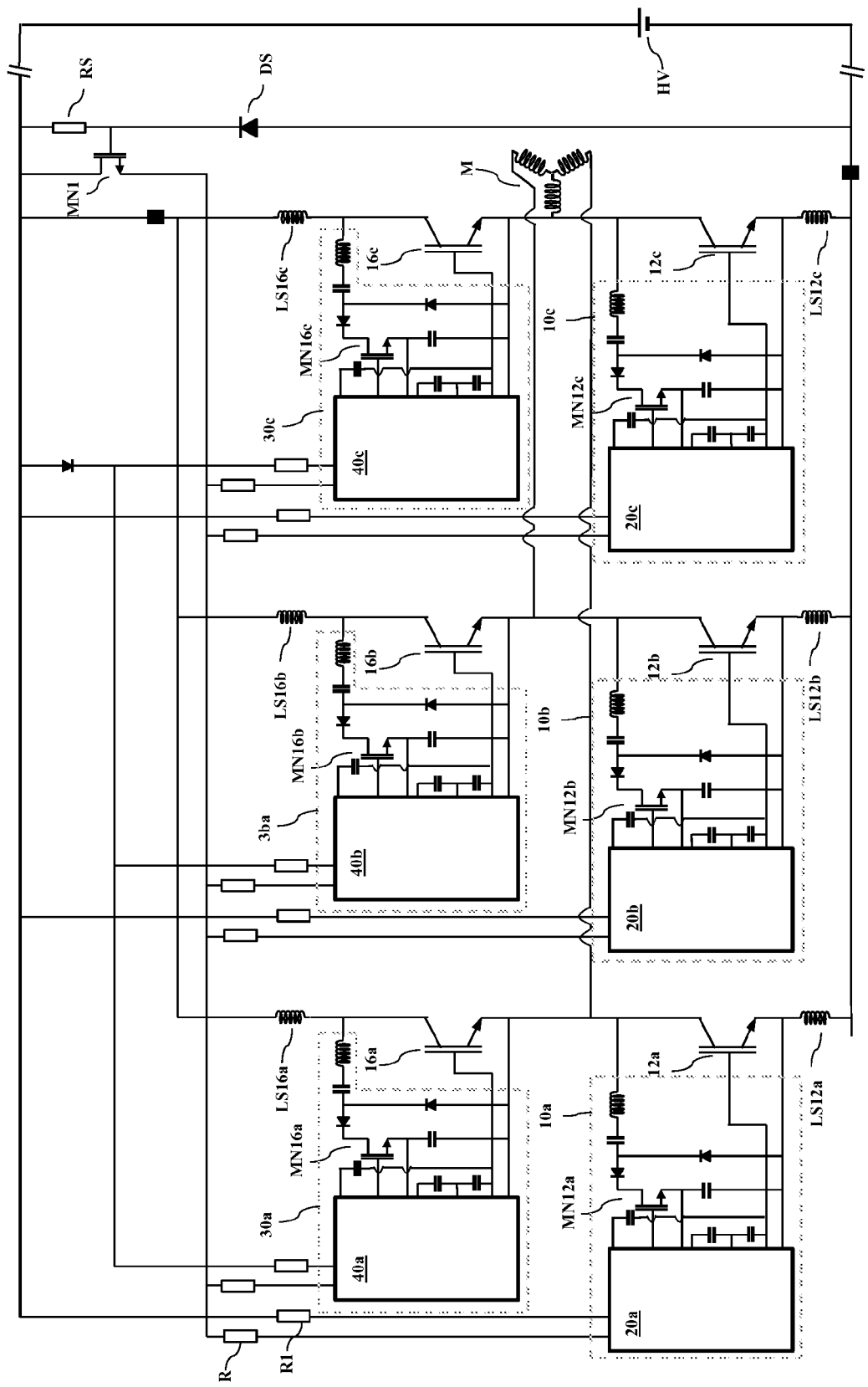
FIG. 6 schematically shows a three-phase half-bridge power module.

FIG. 6 schematically shows a three-phase half bridge power module. The three-phase half bridge power module includes the power inverter described in FIG. 4. The three-phase half-bridge power module further includes two other pairs of IGBT power transistors 12b, 16b and 12c, 16c. Each one of the pairs of IGBT power transistors 12b, 16b and 12c, 16c is arranged in an inverter topology equivalent to the power inverter topology shown in FIG. 4 and formed by the IGBT power transistors 12a and 16a. Each IGBT power transistor 12b, 16b, 12c, 16c is driven by corresponding gate drive circuits 10b, 30b, 10c, 30c. The gate drive circuits 10b, 30b, 10c, 30c are identical to the gate drive circuit 10a described through the FIGS. 1 to 4. A FET transistor MN1 in a cascode topology may be used to couple the supply voltage HV to the gate drive circuits 10b, 30b, 10c, 30c as described for the circuit of FIG. 4. Inductors LS12a, LS12b, LS12c at the low side and inductors LS16a, LS16b, LS16c at the high side are stray inductors. Stray inductors are parasitic inductors in the power module caused by for example interconnection inductances. The topology shown in FIG. 6 may drive a three phase induction or asynchronous motor M as described in the background. The three phase induction or asynchronous motor M is schematically shown in FIG. 6 as a star connection of inductors. Each inductor of the star of inductors has a common terminal and another terminal connected to an output of the inverters 12a, 16a and 12b, 16b and 12c, 16c. The three phase induction or asynchronous motor M may be a power train of for example an electric vehicle.

In another example according to the invention a portion or portions of the gate drive circuit 10a and/or of the gate drive circuits 30a, 10b, 30b, 10c, 30c may be integrated in a single integrated circuit. The portions integrated in the single integrated circuit may be gate drivers 20a, 40a, 20b, 40b, 20c, 20c. The above mentioned charged or pre-charged capacitors C1, C2, C3, C4 and capacitor C5 may be placed outside the single integrated circuit. The capacitors C1, C2, C3, C4 and C5 may have a very large capacitance difficult to integrate on chip. The capacitor C1, C2, C3, C4 and C5 may for example be SMD (surface-mounted device) placed in the power module.

Figure 7:
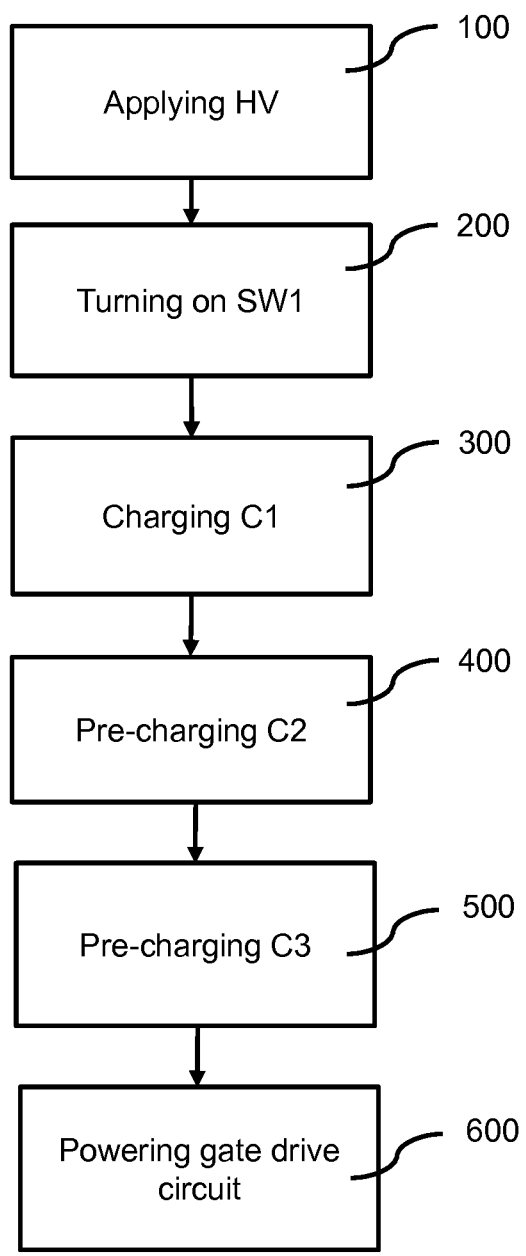
FIG. 7 schematically shows a flow diagram for a method of setting up a get drive circuit.

FIG. 7 shows a flow chart of a method to setup a gate drive circuit 10a. The gate drive circuit 10a drives a power transistor 12a. The method comprises applying 100 a supply voltage HV to the gate drive circuit 10a. The method includes turning on 200 a first switch SW1 such that a first capacitor C1 is electrically coupled to the supply voltage HV. The method further includes charging 300 the first capacitor C1 to obtain a first predetermined voltage across the first capacitor C1 with a first voltage limiter VL in parallel to the first capacitor C1. The method further includes pre-charging 400 a second capacitor C2 to obtain a second predetermined voltage across the second capacitor C2 with a pre-charging circuit PC arranged between a first terminal T11 of the first capacitor C1 and a first terminal T21 of the second capacitor C2. The method further includes pre-charging 500 a third capacitor C3 to obtain a third predetermined voltage across the third capacitor C3 with a second switch SW2 arranged between the first terminal T11 of the first capacitor C1 and the first terminal T31 of the third capacitor C3. The third switch SW3 is configured as a current source to pre-charge the third capacitor C3 and the first terminal T31 of the third capacitor C3 is electrically coupled to the second terminal T22 of the second capacitor C2. The second terminal T32 of the third capacitor C3 is electrically coupled to a gate terminal of the power transistor 12a. The method further includes powering 600 the gate drive circuit 10a with a voltage across the first capacitor C1. The method described in the flow chart of FIG. 7 sets up the gate drive circuit 10a such that the gate drive circuit 10a is capable to drive the gate terminal G of the power transistor 12a during operation. The method so far described powers up the gate drive circuit 10a from the supply voltage HV.

The method shown in FIG. 7 may execute the pre-charging 400 the second capacitor C2 and the pre-charging 500 the third capacitor C3 during charging 300 the first capacitor C1 to obtain the first predetermined voltage across the first capacitor C1. Alternatively the method shown in FIG. 7 may execute the pre-charging 400 the second capacitor C2 and the pre-charging 500 the third capacitor C3 after charging 300 the first capacitor C1 to obtain the first predetermined voltage across the first capacitor C1. Furthermore the pre-charging 500 the third capacitor C3 may be executed after the pre-charging 400 or alternatively during the pre-charging 400. In this way the voltage across each of the capacitors C1, C2 and C3 may be better controlled and built up with reference to the reference potential GND in order to obtain the first, the second and the third predetermined voltages.

The method may additionally comprise before or during the charging 300, charging a fourth capacitor C4 to obtain a further predetermined voltage across the fourth capacitor C4 with a second voltage limiter VL2 arranged between a first terminal T41 of the fourth capacitor C4 and the first terminal of the first terminal T11 of the first capacitor C1. A second terminal of the fourth capacitor C4 is electrically coupled to the reference potential GND. The second voltage limiter VL2 as well as the second voltage limiter VL2 may be zener diodes or a series of zener diodes connected with a cathode terminal to the first terminal of the first and fourth capacitors and with an anode terminal of the zener diode or an anode terminal of a zener diode of the series of zener diodes to the reference potential GND. In this way the voltage across the first and fourth capacitors may be clamped. A 10 V zener diode may be chosen. The second voltage limiter VL may include three 10 V zener diodes in series. The second voltage limiter VL2 may include a 10 V zener diode arranged with a cathode electrically connected the first terminal T41 of the fourth capacitor C4 and with an anode electrically connected to the first terminal T11 of the first capacitor C1. In this example the first predetermined voltage may be 30 V and the further predetermined voltage 40 V. Similarly other voltage limiters (e.g. 10 V zener diodes) may be placed in parallel to the second and third capacitors C2, C3 such that the second and third predetermined voltages may be both 10 V.

In the foregoing specification, the invention has been described with reference to specific examples of embodiments of the invention. It will, however, be evident that various modifications and changes may be made therein without departing from the broader spirit and scope of the invention as set forth in the appended claims. For example, the connections between electrically coupled devices may be any type of connection suitable to transfer signals from or to the respective nodes, units or devices, for example via intermediate devices. Accordingly, unless implied or stated otherwise the connections may for example be direct connections or indirect connections. For example in FIGS. 1 to 3 a dashed line is drawn between the gate drive circuit 10a and the voltage supply HV to indicate that there may be other devices electrically coupling the gate drive circuit 10a to the voltage supply HV. These other devices are further specified, as way of examples, in the practical embodiments of FIG. 4 and FIG. 6.

Because the circuits implementing the present invention are, for the most part, composed of electronic components and circuits known to those skilled in the art, circuit details will not be explained in any greater extent than that considered necessary as illustrated above, for the understanding and appreciation of the underlying concepts of the present invention and in order not to obfuscate or distract from the teachings of the present invention.

Although the invention has been described with respect to specific polarity of potentials, skilled artisans appreciated that polarities of potentials may be reversed.

It is to be understood that FIGS. 1 to 4 and FIG. 6 show some architectures of the present invention. The architectures depicted herein are merely exemplary, and that in fact many other architectures can be implemented which achieve the same functionality. In an abstract, but still definite sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected," or "operably coupled," to each other to achieve the desired functionality.

Also for example, in the embodiments of FIGS. 2 to 4, the illustrated elements of the gate driver 20a of the gate drive circuit 10a are circuitry that may be located on a single integrated circuit or within a same device. Alternatively, the gate driver 20a may include any number of separate integrated circuits or separate devices interconnected with each other.

In the claims, any reference signs placed between parentheses shall not be construed as limiting the claim. The word 'comprising' does not exclude the presence of other elements or steps then those listed in a claim. Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements. The mere fact that certain measures are recited in mutually different claims does not indicate that a combination of these measures cannot be used to advantage.

The invention claimed is:

1. A gate drive circuit for a power transistor, the gate drive circuit comprising:
   a first switch,
   a first capacitor, a first terminal of the first capacitor being electrically coupled to the first switch, the first switch being electrically coupled between the first terminal and a voltage supply of the power transistor, a second terminal of the first capacitor being electrically coupled to the reference potential,
   a first voltage limiter in parallel with the first capacitor for limiting a voltage across the first capacitor to a first predetermined voltage,
   a second capacitor,
   a pre-charging circuit arranged between the first terminal of the first capacitor and a first terminal of the second capacitor,
   a third capacitor, a first terminal of the third capacitor being electrically coupled to a second terminal of the second capacitor, a second terminal of the third capacitor being electrically coupled to a gate terminal of the power transistor,
   a second switch arranged between the first terminal of the first capacitor and the second terminal of the second capacitor,
   a third switch arranged between the first terminal of the third capacitor and the reference potential,
   a fourth switch arranged between the second terminal of the third capacitor and the reference potential,
   during a setup of the gate drive circuit after applying the voltage supply:
   the gate drive circuit being configured to arrange the first switch in an on state to electrically couple the supply voltage to the first terminal for charging the first capacitor to obtain the first predetermined voltage across the first capacitor, the gate drive circuit being further configured to configure the pre-charging circuit to pre-charge the second capacitor to obtain a second predetermined voltage across the second capacitor and the gate drive circuit being further configured to pre-charge the third capacitor to obtain a third predetermined voltage across the third capacitor, the gate drive circuit being configured to be powered by the voltage across the first capacitor.

2. A gate drive circuit according to claim 1 further comprising a controller wherein the controller is configured to arrange the fourth switch in an on state to electrically couple the second terminal of the third capacitor to the reference potential and to arrange the first switch in an on state to electrically couple the supply voltage to the first terminal; wherein
   during or after charging the first capacitor, the controller is further configured to configure the pre-charging circuit to pre-charge the second capacitor and to arrange the second switch in an off state to electrically decouple the second terminal of the second capacitor from the first terminal of the first capacitor and to arrange the third switch in an on state to electrically couple the second terminal of the second capacitor to the reference potential; wherein
   during the pre-charge of the third capacitor, the controller is further configured to arrange the second switch as a current source and to arrange the third switch in an off state to electrically decouple the first terminal of the third capacitor from the reference potential; and wherein
   the controller is further configured to be powered by the voltage across the first capacitor.

3. A gate drive circuit according to claim 2 wherein the controller is further configured to arrange the first switch in an off state to electrically disconnect the voltage supply from the first capacitor when a voltage across the first capacitor has reached the first predetermined voltage, a voltage across the second capacitor has reached the second predetermined voltage and a voltage across the third capacitor has reached the third predetermined voltage.

4. A gate drive circuit according to claim 2 wherein the controller comprises an input and wherein the controller is further configured, after the setup of the gate drive circuit, to i) arrange the second switch in an on state, the third switch in an off state, and the fourth switch in an off state for allowing a transfer of charges from the third capacitor to a gate capacitance of the power transistor, or ii) maintain the fourth switch in an on state, the off or on state of the fourth switch being dependent on a status of the input.

5. A gate drive circuit according to claim 4 wherein the controller is further configured to arrange the fourth switch in an off state when the input is electrically coupled to the reference ground and wherein the fourth switch is arranged in an on state when the input is not electrically connected at one side.

6. A gate drive circuit according to claim 1 further comprising:
a fourth capacitor, a first terminal of the fourth capacitor being electrically coupled to the voltage supply, a second terminal of the fourth capacitor being electrically coupled to the reference potential,
a second voltage limiter arranged between the first terminal of the fourth capacitor and the first terminal of the first capacitor.

7. A gate drive circuit according to claim 1 further comprising:
a fifth switch,
a fifth capacitor,
an inductor,
a first diode,
a second diode,
the fifth switch electrically coupled between the first terminal of the first capacitor and a cathode of the first diode, a first terminal of the fifth capacitor being electrically coupled to an anode of the first diode and a cathode of the second diode, a second terminal of the fifth capacitor being electrically coupled to a terminal of the inductor, another terminal of the inductor being electrically coupled to a collector terminal or to a drain terminal of the power transistor and an anode of the second diode being electrically coupled to the reference potential.

8. A gate drive circuit according to claim 7 wherein during operation of the power transistor the controller is configured to arrange the fifth switch in an on and off state for maintaining the first predetermined voltage across the first capacitor.

9. A gate drive circuit according to claim 1 further comprising a third voltage limiter in parallel to the second capacitor and fourth voltage limiter in parallel to the third capacitor.

10. A gate drive circuit according to claim 1 wherein the first voltage limiter is a zener diode or a series of zener diodes.

11. A gate drive circuit according to claim 1 wherein the further voltage limiter and/or the third voltage limiter and the fourth voltage limiter are a zener diode or a series of zener diodes.

12. A power module comprising:
a power transistor (12a),
a gate drive circuit including:
a first switch,
a first capacitor, a first terminal of the first capacitor being electrically coupled to the first switch, the first switch being electrically coupled between the first terminal and a voltage supply of the power transistor, a second terminal of the first capacitor being electrically coupled to the reference potential,
a first voltage limiter in parallel with the first capacitor for limiting a voltage across the first capacitor to a first predetermined voltage,
a second capacitor,
a pre-charging circuit arranged between the first terminal of the first capacitor and a first terminal of the second capacitor,
a third capacitor, a first terminal of the third capacitor being electrically coupled to a second terminal of the second capacitor, a second terminal of the third capacitor being electrically coupled to a gate terminal of the power transistor,
a second switch arranged between the first terminal of the first capacitor and the second terminal of the second capacitor,
a third switch arranged between the first terminal of the third capacitor and the reference potential,
a fourth switch arranged between the second terminal of the third capacitor and the reference potential,
during a setup of the gate drive circuit after applying the voltage supply:
the gate drive circuit being configured to arrange the first switch in an on state to electrically couple the supply voltage to the first terminal for charging the first capacitor to obtain the first predetermined voltage across the first capacitor, the gate drive circuit being further configured to configure the pre-charging circuit to pre-charge the second capacitor to obtain a second predetermined voltage across the second capacitor and the gate drive circuit being further configured to pre-charge the third capacitor to obtain a third predetermined voltage across the third capacitor, the gate drive circuit being configured to be powered by the voltage across the first capacitor;
a further power transistor, a gate terminal of the further power transistor electrically coupled to a further gate drive circuit, an emitter or source terminal of the further power transistor being electrically coupled to the collector terminal of the power transistor and a collector or drain terminal of the further power transistor being electrically coupled to the supply voltage.

13. A power module as claimed in claim 12 further comprising a voltage clamp derived from the supply voltage, the voltage clamp comprising a field effect transistor, a gate terminal of the field effect transistor being electrically coupled to a voltage source derived from the supply voltage, a drain of the FET transistor electrically coupled to the supply voltage, a source terminal of the FET transistor being electrically coupled to a first resistor and a second resistor, the first resistor and the second resistor being electrically coupled in series with the first switch of the gate drive circuit and with a first switch of the further gate drive circuit.

14. A power module as claimed in claim 13 wherein the first terminal of the fourth capacitor of the gate drive circuit is electrically coupled to the voltage supply by means of a series resistor and wherein a first terminal of a fifth capacitor of the further gate drive circuit is electrically coupled to the voltage supply by means of a series resistor.

15. A power module as claimed in claim 12 further comprising
two pairs of power transistors, each one of the pairs being arranged in an inverter topology, four further gate drive circuits for driving a gate terminal of each of the power transistors in the pairs, the power module being arranged in a three phase half-bridge or full-bridge topology.

16. A power module according to claim 15 wherein the power transistors are insulated gate bipolar transistors.

17. A method for setting up a gate drive circuit for a power transistor, the method comprising:
applying a voltage supply to the gate drive circuit,
turning on a first switch to electrically couple the supply voltage to the first terminal of a first capacitor,
charging the first capacitor to obtain a first predetermined voltage across the first capacitor with a voltage limiter in parallel to the first capacitor,
pre-charging a second capacitor to obtain a second predetermined voltage across the second capacitor with a pre-charging circuit arranged between a first terminal of the first capacitor and a first terminal of the second capacitor,
pre-charging a third capacitor to obtain a third predetermined voltage across the third capacitor with a second switch arranged between the first terminal of the first capacitor and a first terminal of the third capacitor, the third switch configured as a current source, the first terminal of the third capacitor electrically coupled to the second terminal of the second capacitor, the second terminal of the third capacitor electrically coupled to a gate terminal of the power transistor,
powering the gate drive circuit with a voltage across the first capacitor.

18. The method of claim 17 further comprising before or during the charging:
charging a fourth capacitor to obtain a further predetermined voltage across the fourth capacitor with a further voltage limiter arranged between a first terminal of the fourth capacitor and the first terminal of the first terminal of the first capacitor, a second terminal of the fourth capacitor connected to the reference potential.

* * * * *